United States Patent

Mraz et al.

[11] Patent Number: 5,187,938
[45] Date of Patent: Feb. 23, 1993

[54] METHOD AND A DEVICE FOR PRECOOLING THE HELIUM TANK OF A CRYOSTAT

[75] Inventors: Beat Mraz, Hombrechtikon; Christoph Notzli, Schwerzenbach; Ernst Ungricht, Uster; Daniel Marek, Hegnau, all of Switzerland

[73] Assignee: Spectrospin AG, Switzerland

[21] Appl. No.: 523,747

[22] Filed: May 15, 1990

[30] Foreign Application Priority Data

May 18, 1989 [DE] Fed. Rep. of Germany ....... 3916212

[51] Int. Cl.⁵ .............................. F25B 19/00
[52] U.S. Cl. .................. 62/51.1; 415/182.1; 415/199.5; 415/214.1; 417/352
[58] Field of Search ............. 62/48.2, 48.3, 51.1, 62/55.5, 434; 415/182.1, 198.1, 199.4, 199.5, 214.1; 417/352

[56] References Cited

U.S. PATENT DOCUMENTS

| | | | |
|---|---|---|---|
| 2,956,732 | 10/1960 | Stalker | 230/122 |
| 2,985,356 | 5/1961 | Beecher | 62/55.5 |
| 3,303,660 | 2/1967 | Berg | 62/48.2 |
| 3,850,004 | 11/1974 | Vander Arend | 62/115 |
| 4,187,689 | 2/1980 | Selcukoglu et al. | 62/48.2 |
| 4,510,771 | 4/1985 | Matsuda et al. | 62/51.1 |

FOREIGN PATENT DOCUMENTS

| | | |
|---|---|---|
| 0115206 | 12/1983 | European Pat. Off. . |
| 0223868 | 11/1985 | European Pat. Off. . |
| 3724562 | 1/1989 | Fed. Rep. of Germany . |
| 2038536 | 1/1971 | France . |
| 952451 | 3/1964 | United Kingdom . |
| 1090160 | 9/1965 | United Kingdom . |
| 88/05519 | 7/1988 | World Int. Prop. O. . |

OTHER PUBLICATIONS

IEEE Transactions on Magnetics, vol. 24, No. 2, Mar. 1988, pp. 1230-1232.
Jahnke et al.: First Superconducting Prototype Magnets for a Compact Synchroton Radiation Source in Operation.

*Primary Examiner*—Ronald C. Capossela
*Attorney, Agent, or Firm*—Walter A. Hackler

[57] ABSTRACT

In a method and a device for precooling the helium tank of a cryostat, in particular one for accommodating a superconductive magnet coil, contamination of the helium tank is avoided by the fact that helium gas is cooled down to the temperature of boiling nitrogen in a closed circuit, the helium gas is then circulated through the helium tank and thereafter cooled down again to the temperature of boiling nitrogen. The helium tank is cooled by means of the helium gas, which has a temperature of 77 K, until the tank has reached that temperature. The interior of the helium tank getting into contact exclusively with helium, the helium tank can be filled with liquid helium immediately after it has reached the precooling temperature, without the need to clean the tank first.

21 Claims, 2 Drawing Sheets

METHOD AND A DEVICE FOR PRECOOLING THE HELIUM TANK OF A CRYOSTAT

BACKGROUND OF THE INVENTION

The present invention relates to a method and a device for precooling the helium tank of a cryostat, in particular an optical cryostat comprising optical components in the helium tank, an NMR cryostat, a medical NMR cryostat for nuclear spin tomography for accommodating a superconductive magnet coil.

Cryostats accommodating a superconductive magnet coil have been previously known, for example in the field of nuclear magnetic resonance spectrometry or nuclear spin tomography (DE-A1-29 06 060, DE-B2-37 24 562). Such a cryostat comprises several tanks nested in each other, the innermost of them housing a magnetic coil and being filled in operation with liquid helium at a temperature of approx. 4 K. An outer tank contains liquid nitrogen at a temperature of approx. 77 K. Both tanks are vacuum-insulated relative to each other and from the surrounding temperature. The evacuated spaces which contain radiation shields are maintained at intermediate temperatures so that both heat transmission and heat radiation are reduced to a minimum. Before the first startup and also following all maintenance or repair work carried out on the magnetic coil or the cryostat, the latter must be cooled down to operating temperatures. Different methods of cooling down the cryostat to such operating temperatures have been known from the prior art. According to one of these methods it is proposed to fill the nitrogen tank with liquid nitrogen and the helium tank with liquid helium, and to cool it down in this way. However, such a method would require very important quantities of liquid helium as the magnetic coil and the inner space of the cryostat would have to be cooled down solely by the liquified helium. However, in spite of its low temperature of 4 K liquid helium has a considerably smaller capacity to absorb heat than liquid nitrogen at a temperature of 77 K. This lower heat-absorption capacity would lead to a considerable input of time, not to speak of the important consumption of liquid helium which, besides, is very expensive. These disadvantages cannot be justified by the argument that in order to avoid contaminations the helium tank is brought into contact in this manner exclusively with helium as a cooling medium, and this the less when the tank contains elements of important heat capacity, as for example a superconductive solenoid coil.

According to another proposed method, the evacuated spaces between the nitrogen and the helium tanks are cooled down by dry nitrogen gas so far that the helium tank is cooled to a temperature of 77 K by thermal conduction. This method is, however, connected with the disadvantage that the nitrogen has to be removed subsequently from the evacuated space. However, since this normally can be achieved only imperfectly, the nitrogen residues remaining in the evacuated space will freeze down on the colder helium tank when the system is put into operation subsequently. In addition, possible errors in operation of the vacuum valves present an increased safety risk as an overpressure may build up due to vaporization of condensed nitrogen and/or air, which may create an explosion risk. In addition, such indirect cooling via the evacuated space between the nitrogen tank and the helium tank is ineffective, time-consuming and will in addition lead to icing of the outer jacket of the cryostat in cases where only a single space exists between the nitrogen tank and the helium tank on the one hand and the environment on the other hand.

According to another—the most commonly used—method it is, therefore, proposed to fill the helium tank initially with liquid nitrogen whereby the tank is cooled down to a temperature of 77 K. As a result of this cooling step, most of the total heat is withdrawn from the cryostat. On the other hand, however, the liquid nitrogen has to be removed completely from the helium tank after the cooling step. Any nitrogen residues remaining in the tank would reduce the service life of the helium, which is normally in the range of one year, and in particular any nitrogen residues remaining on the magnetic coil would impair the operating safety of the magnetic coil, i.e. increase the risk of a quench, i.e. of an unwanted transition from the superconductivity to the normal-conductivity state of the magnetic coil. In the case of an optical cryostat, there would further be the risk of a coat of solid nitrogen forming on the optical components located in the path of the rays, such as windows, mirrors or the like. If the nitrogen contains a certain portion of oxygen, i.e. if the nitrogen is contaminated with oxygen, then this paramagnetic component will be attracted by the magnet coil when the latter is started up. In addition, the conversion work necessary for filling in and/or exchanging the liquified gases provides the increased risk that air from the atmosphere and/or humidity may condense into the system, and this may likewise lead to faulty operation and impair the service life of the helium. Moreover, there is an increased safety risk, due to an increased risk of operating errors.

SUMMARY OF THE INVENTION

Now, it is the object of the present invention to provide a method and/or a device for precooling the helium tank of a cryostat which avoid the before-mentioned disadvantages.

The method according to the invention achieves this object by the fact that helium gas is cooled down to the temperature of boiling nitrogen in a closed circuit, that the helium gas is then circulated through the helium tank and thereafter cooled down again to the temperature of boiling nitrogen.

The method according to the invention, therefore, provides that the helium tank of the cryostat is passed by helium gas which has been cooled down previously to the temperature of boiling nitrogen, i.e. to a temperature of 77 K. On its path through the helium tank, the helium gas absorbs heat and then leaves the helium tank in this heated-up state in order to be cooled down subsequently to the temperature of boiling nitrogen during which process the heat previously absorbed is given off again. Thanks to this circuit, during which helium gas at a temperature of 77 K is circulated through the helium tank, thermal energy is withdrawn from the tank until it finally has been cooled down to the same temperature of 77 K. This method provides the considerable advantage that the interior of the helium tank gets into contact exclusively with helium so that it cannot be contaminated by nitrogen or other gases. And given the fact that no other gas than helium gets into contact with the helium tank during this process, the tank need not be cleaned after it has been cooled down to a temperature of 77 K, but can be filled with liquid helium directly following the cooling-down process. Now, a considerably smaller quantity of liquid helium is required to cool the magnet coil in the helium tank, and the latter as well, down from the temperature of 77 K to a temperature of 4 K, since the greatest part of the total heat of the cryostat has already been withdrawn by the fact that the tank has been cooled down before to a temperature of 77 K. In addition, the consumption of gaseous helium is reduced to a minimum, due to the closed helium gas circuit. The method according to the invention, therefore, provides the advantage of enabling the helium tank of a cryostat to be cooled down at low cost and in a safe manner. It combines the advantage of having the tank cooled down with the aid of nitrogen from room temperature to approx. 77 K with the advantage that the helium tank and, consequently, the magnet coil or optical components arranged therein, get into contact exclusively with helium.

According to a preferred embodiment of the invention, the helium gas is cooled down in a heat exchanger, in particular a plate heat exchanger. The latter withdraws from the helium gas arriving from the cryostat the thermal energy absorbed in the helium tank of the cryostat and gives this thermal energy off to the cooling agent of the heat exchanger. Preferably, the helium gas flows through the heat exchanger, while boiling nitrogen is circulated around the heat exchanger. The boiling nitrogen then picks up its enthalpy of vaporization from the heat exchanger which in turn withdraws the required heat from the helium gas flowing through it. Given the fact that the helium circuit is arranged inside, whereas the nitrogen circuit is arranged outside the heat exchanger, the helium gas circulating through the closed circuit can be kept under pressure while the boiling nitrogen circulating around the outside of the heat exchanger may assume the prevailing atmospheric pressure. In addition, any nitrogen assuming the gaseous state is permitted to escape without any problems. The energy required by the nitrogen for its transition from the liquid to the gaseous state is withdrawn from the helium gas so that the latter is cooled.

In order to keep the heat transition between the gaseous helium and the liquid nitrogen going in the heat exchanger, the heat exchanger is constantly supplied with a quantity of liquid nitrogen corresponding to the vaporizing nitrogen so that the level of liquid nitrogen is kept constant.

According to a preferred embodiment of the invention, the helium gas is delivered by means of a compressor which supports the natural circulation of the helium gas resulting from the temperature differences in the helium gas. The use of a compressor enables more heat to be dissipated from the cryostat so that precooling of the helium tank can be effected in considerably less time.

The pressure of the helium gas is maintained advantageously by means of a reservoir. By maintaining the helium gas at a slight pressure it is ensured that the helium gas in the circuit cannot be contaminated by the environmental air if a leakage should occur. In addition, the pressure in the helium tank is kept constant this way during the cooling process and the resulting contraction of the helium gas.

The device according to the invention achieves the beforementioned object by the fact that a closed helium gas circuit is provided interconnecting at least the helium tank of the cryostat and a heat exchanger chamber of a heat exchanger.

It is, therefore, an advantageous feature of this device that the helium tank communicates with a heat exchanger chamber arranged outside the cryostat. As has been described before, the heat exchanger chamber, being part of a heat exchanger, serves to withdraw heat from the helium tank by means of the helium gas circulating in the system.

In MR tomography in medical applications operating safety is, therefore, considerably improved by the device according to the invention as it reduces the risk of a quench which, as has been mentioned at the outset, occurs particularly frequently when the magnet coil—which in tomography surrounds the person under examination—has got into contact with nitrogen.

According to a particularly preferred arrangement, the heat exchanger chamber is arranged inside a plate condenser. Plate condensers provide the advantage that they exhibit a large surface while, on the other hand, they can be supplied with a gas under pressure.

Preferably, the heat exchanger is surrounded by boiling nitrogen and suspended in an open tank. The open tank contains in addition the boiling nitrogen which provides the advantage that any nitrogen which has assumed the gaseous state, i.e. the nitrogen gas, can escape from the tank without any problems.

According to a preferred embodiment of the invention, the compressor used for delivering the helium gas is a multistage axial-flow compressor with impeller and guide wheels. The gas flow, being redressed between the individual compressor stages, ensures high efficiency of the compressor so that the drive power required by the compressor is only low and this has the result to reduce the heat transmission from the compressor to the helium gas.

As high tightness to helium is a requirement for the compressor and as such tightness cannot be achieved by common shaft seals, due to the extreme temperature differences, the drive is arranged, advantageously, in the compressor housing. One thereby avoids the necessity to transmit the driving movement to the impeller wheel from a drive located outside the compressor and through the compressor housing, and to seal the passage through the housing. According to a particularly advantageous solution, the impeller wheel is arranged around the drive, which extends axially relative to the direction of flow, and the drive consists of an electric motor.

In order to pick up as little heat as possible from the drives, the guide wheel has a core matching the diameter of the axially arranged drive. This causes the gas current to flow past the outside of the drives so that it does not get into contact with the drives as such. At the same time, in this way the drives preserve a suitable operating temperature as they are heated up constantly by the electric resistance and the friction in the bearings. The bearings of the impeller wheels are greased by a special grease suited for low temperatures so that a small part only of the drive energy is consumed by them.

According to an advantageous arrangement, the gas flow entering the compressor is guided around the drives due to the fact that the compressor inlet has a conically widening shape and comprises an inner cone which splits the gas flow up to the shape of a conical shell and guides it axially past the outside of the compressor drive. Consequently, the incoming gas is deflected already before the first compressor stage in such a way that it contacts only the impeller wheel, flowing around the drive which is enclosed by the impeller wheel.

The gas flow leaving the compressor is bundled advantageously due to the fact that the outlet flow of the compressor tapers conically, the taper corresponding to that of the inlet. In addition, the inside of the conical jacket of the outlet is provided with longitudinal guide elements serving as guiding means for the rotational gas flow. These guide elements reduce the rotational momentum of the helium gas leaving the last compressor stage.

A simple and low-cost structure of the compressor is achieved when a sandwich construction is selected for the impeller and guide stages of the compressor and the individual stages are interconnected by circumferentially arranged tension bars. Such a design enables the structure of the compressor to be adapted to the special requirements of the particular application so that the compressor can be adapted precisely to the quantity of gas to be supplied and its flow velocity. Efficient tightness to helium is achieved when seals, in particular circular seals, are arranged between the individual impeller and guide stages. Such seals prevent on the one hand helium gas from escaping into the atmosphere and, on the other hand, the helium gas from being contaminated by air entering the compressor.

Further features, advantages and details of the invention will become apparent from the following specification which describes a particularly preferred embodiment of the invention with reference to the drawing, it being understood that the invention is by no means restricted to the described embodiment, but that the described features may be employed individually or in any combination thereof without leaving the scope of the present invention.

DESCRIPTION OF THE PREFERRED EMBODIMENT

Figure 1:
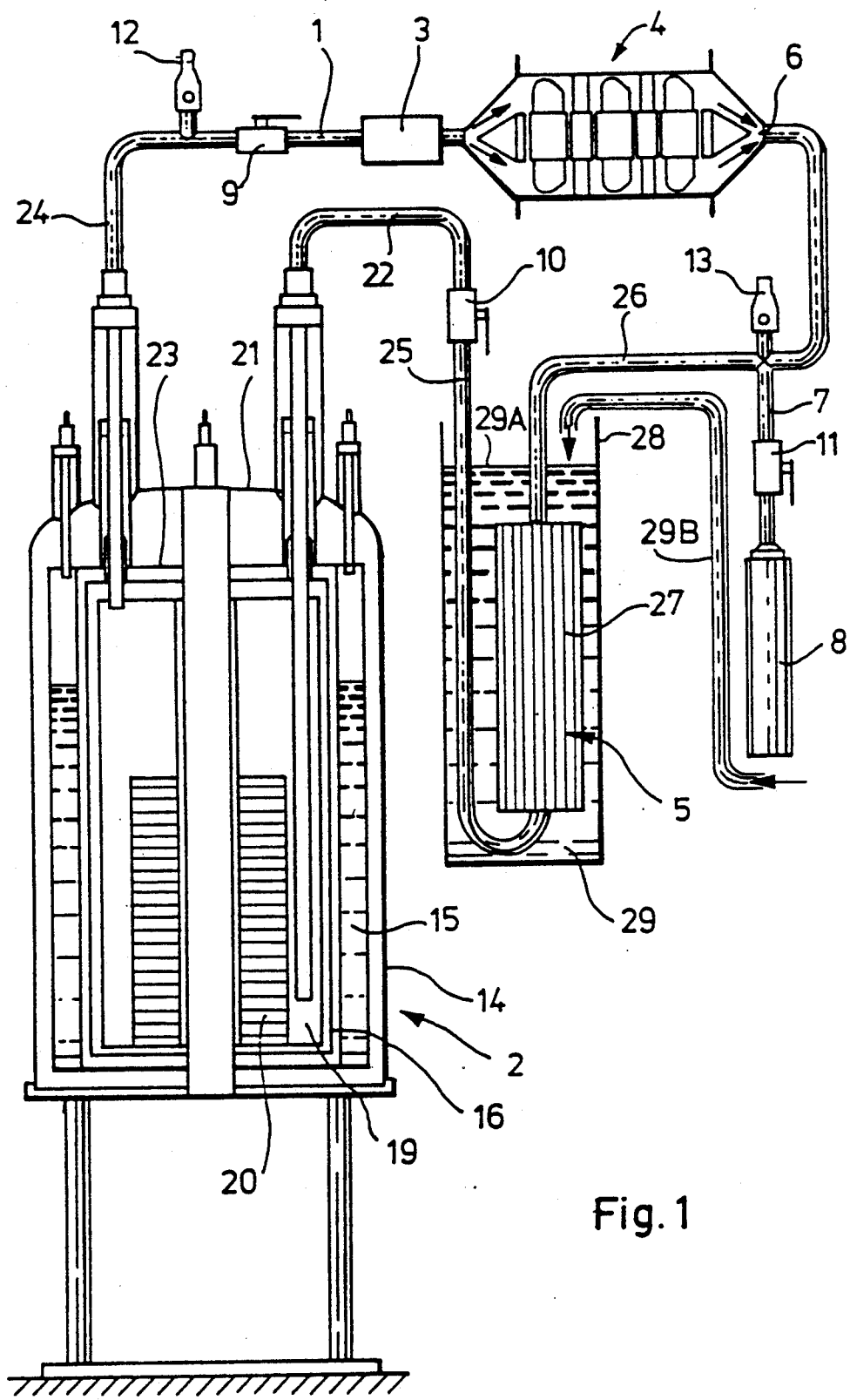
FIG. 1 shows a diagram of the circuit.

In the diagram of FIG. 1, a cryostat 2, a first heat exchanger 3, a compressor 4 serving as circulation pump for the helium gas circulated through the pipelines and a second heat exchanger 5 are interconnected by a heat-insulated pipe 1. Following the outlet 6 of the compressor 4, the pipe 1 is connected by a connection line 7 to a reservoir 8 containing helium. In addition, pipe 1 and the connection line 7 are provided with shut-off valves 9, 10 and 11 which serve to interrupt the gas flow in the lines. The shut-off valve 11 serves in addition for reducing the pressure of the helium in the reservoir 8. Finally, the line 1 is equipped with safety valves 12 and 13 by means of which the closed circuit can be vented in case excessive overpressure should occur during heating-up of the system, due to the expansion of the cold helium gas. The nitrogen tank 15 maintains liquid nitrogen therein in a conventional manner.

The cryostat 2 comprises in its outer shell 14, viewed from the outside to the inside, a nitrogen tank 15, a radiation shield 16, a helium tank 19 and a bobbin 20 located in the helium tank 19. The cryostat 2 is equipped at its top 21 with a line section 22 mounted in pipe ends by means of which it is guided through the outer jacket 14, a nitrogen radiation shield 23 and the radiation shield 16, ending in the helium tank 19. A second line section 24 is likewise connected to the helium tank 19 and passed through the radiation shields 16 and 23 and then outwardly through the jacket 14. The line sections 22 and 24 are followed by the shut-off valves 10 and 9 by means of which the interior of the helium tank 19 can be connected to communicate with the pipe 1.

Figure 2:
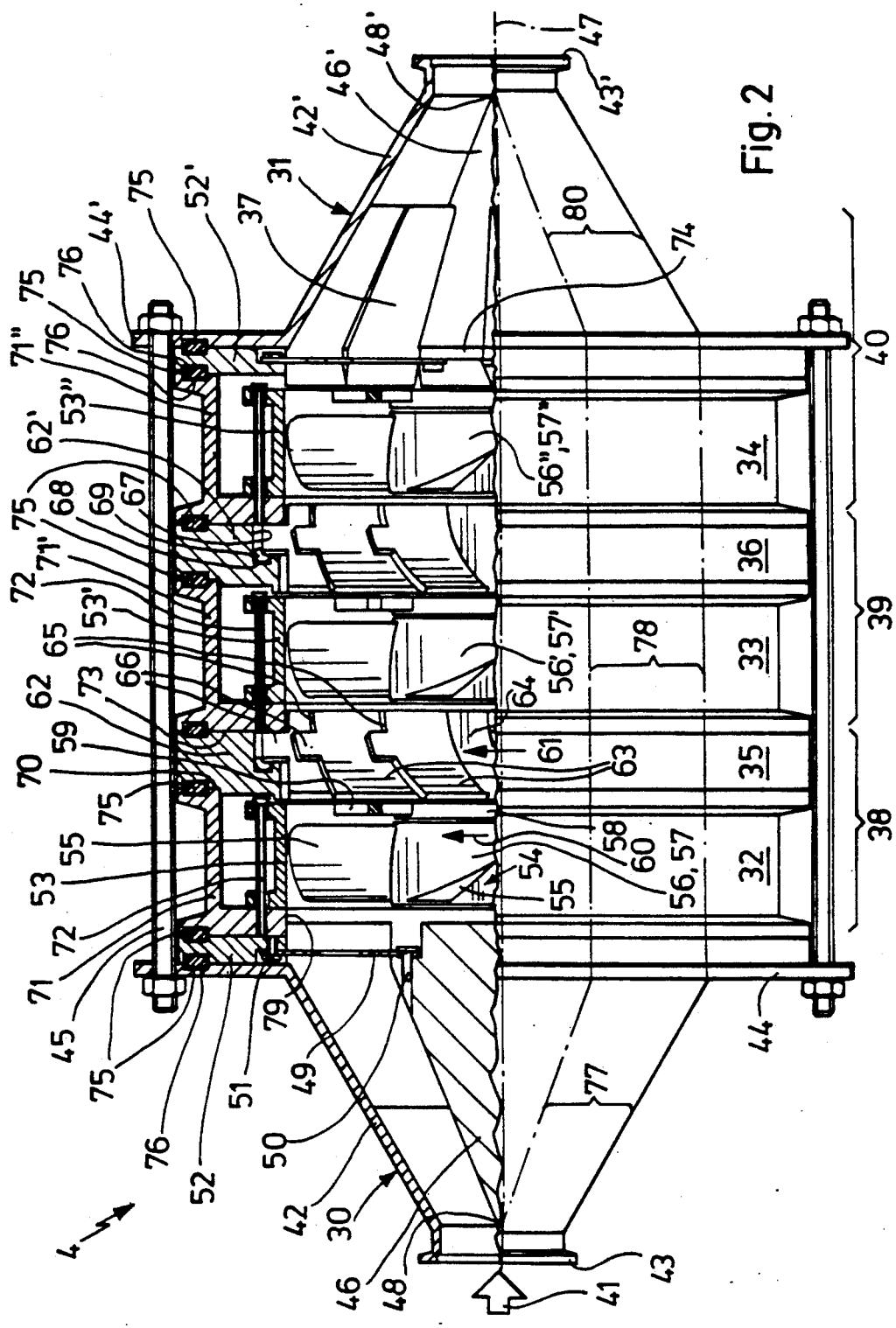
FIG. 2 shows a side view of the compressor delivering the helium gas, with the upper half of the compressor cut open.

The heat exchanger 5, which preferably is connected to the line 1 via flexible hoses 25 and 26, comprises a plurality of parallel hollow plates 27 forming the cooling surface for the flow of helium gas. The heat exchanger 5 is suspended in a tank 28 filled with liquid nitrogen 29. The liquid nitrogen 29 flows around the full surface of the heat exchanger 5 and maintains it at the boiling temperature of the nitrogen, i.e. at 77 K. The level 29A of liquid nitrogen 29 is maintained constant by the addition of liquid nitrogen through a pipe 29B. This constant supply of liquid nitrogen corresponds to the amount vaporizing from the tank 28. Viewed in the direction of flow, the heat exchanger 3 is arranged in the line 1 before the compressor 4. The heat exchanger 3 serves as heating for the helium gas in the line 1 in order to prevent the compressor 4 from cooling down excessively. The heat exchanger 3, therefore, serves as protection for the compressor 4. For closer details of the compressor 4, the reader is referred to FIG. 2 showing the compressor 4 in enlarged scale. The compressor 4 comprises between its intake pipe 30 and its outlet pipe 31 three impeller stages 32, 33 and 34 with two guide stages 35 and 36 arranged therebetween. The impeller stage 32 and the guide stage 35 form together a first compressor stage 38, while the impeller stage 3 and the guide stage 36 form together a second compressor stage 39. Finally, the outlet pipe 31 includes another guide system 37 which, together with the impeller stage 34, forms a third compressor stage 40. The intake pipe 30 through which the helium gas enters the compressor in the direction indicated by arrow 41, is equipped with a conically widening jacket 42 provided with two flanges 43 and 44. The flange 43 serves as a connection means for the line 1, while the flange 44 coacts with tie bolts 45 for holding the compressor 4 together, as will be described in more detail further below. The jacket 42 encloses a tapering cone 46 whose axis extends concentrically to the longitudinal axis 47 of the compressor 4 and whose pointed end 48 faces the flange 43. The cone 46 is mounted on a ring 52 of the housing, by means of a mounting element 49 and screws 50 and 51, the axis of the bore of the ring 52 coinciding with the longitudinal axis 47 of the compressor 4.

The intake pipe 30 is followed by the impeller stage 32 of the first compressor stage 38. The impeller stage 32 comprises an impeller stage housing 53 of substantially annular shape, with the axis of its bore likewise coinciding with the longitudinal axis 47 of the compressor. The impeller stage housing 53 accommodates the impeller wheel 54 whose blades 55 extend from the hub 56 right to the inner face of the impeller stage housing 53. The hub 56 of the impeller wheel 54 encloses the rotor of an electric motor which serves as drive 57 for the impeller wheel, the stator 58 of the motor being fixed to the impeller stage housing 53 by means of a mounting element 59. In the embodiment illustrated in FIG. 2, the rotor turns in the direction indicated by arrow 60. The impeller stage 32 is followed, in the direction of flow, by the guide stage 35 which consists of a guide wheel 51 and its surrounding housing 62. The guide wheel 61 is equipped with guide blades 63 extending from the hub 64 right to the inner face of the housing 62. The guide blades 63 are fixed in the housing 62 in a simple way, i.e. by means of noses 66 provided on the tops 65 of the guide blades 63 which noses engage a recess 67 in the housing 62 provided with an annular groove 68 accommodating a compression seal 69 which is deformed by the noses 66 of the guide blades 63 as they are introduced into the recess 67 whereby the noses 66 are fixed in position. Preferably, the diameter of the hub 64 of the guide wheel 61 corresponds to the diameter of the hub 56 of the impeller wheel 54. The curvature of the impeller blades 63 is selected in such a manner that the rotational helium gas entering the guide wheel 61 is deflected to flow coaxially to the longitudinal axis 47 so that the gas enters the second impeller stage 33 in a direction of flow coaxial to the longitudinal axis 47.

The outer circumferential edge 70 of the housing 62, facing the impeller stage 32, rests against a connection ring 71 of substantially L-shaped cross-section which in turn in fastened to the impeller stage housing 53 by a screw 72. The inner surface of the impeller stage housing 53 is arranged flush with the inner surface 79 of the connection ring 71. The circumferential edge 73 facing the impeller stage 33 is followed by a second connection ring 71' which is fastened to the impeller stage housing 53' of the second impeller stage 33 by a screw 72'. The structure of the second end of the third impeller stages 33 and 34, and of the second guide stage 36 are identical to the structure of the first impeller stage 32 and the first guide stage 35, respectively.

Finally, the outlet pipe 31 consists of a conical jacket 42' which corresponds to the jacket 42 and which also encloses a cone 46' arranged in such a way that its pointed end 48' faces the flange 43' of the outlet pipe 31'. The end 74 opposite the pointed end 48' is connected to a housing ring 52', via the guiding system 37, so that the axis of the cone 46' coincides with the longitudinal axis 47 of the compressor 4.

The two flanges 44 and 44' of the intake and the outlet pipes 30 and 31 are interconnected by a plurality of tie bolts 45 arranged about the circumference of the compressor 4. These tie bolts 45 act to press the adjacent housing portions of the compressor 4 together, namely the housing ring 52, the connection ring 71, the housing 62 of the first guide stage 35, the connection ring 71', the housing 62' of the second guide stage 36, the connection ring 71" and the housing ring 52'. Sealing is effected by means of circular seals 75 arranged in corresponding annular grooves 76 provided between every two of the before-mentioned housing elements. When the tie bolts 45 are tightened, then these circular seals 75 are urged into and compressed in the annular groove 76 whereby the interior of the compressor 4 is sealed safely from the atmosphere surrounding the compressor 4. The cone 46 acts to divide the helium entering the compressor 4 through the opening of the flange 43 in the direction of arrow 41 so that the gas flows around the cone 46 in the form of a conical shell of the cross-section 77. During its passage through the impeller and the guide stages 32 to 36, the flow assumes the cross-section 78, the latter being defined by the hubs 56, 56', 56", 64 and 64' and the inner surfaces of the impeller stage housings 53, 53' and 53" and the housings 62 and 62'. This provides the advantage that the cold helium gas does not flow against, but rather around the three drives 57, 57' and 57" accommodated in the hubs 56, 56' and 56" so that the drives are not cooled down excessively. At the outlet of the impeller stage 34, the still rotational helium gas is redressed parallel to the surface line of the jacket 42', by means of a guiding system 37, and then formed, by the cone 46' leaving a flow cross-section 80, into a concentrated gas current leaving the compressor 4 through the opening of the flange 43'.

The compressor 4 illustrated in FIG. 2 comprises 3 compressor stages 38, 39 and 40. It is an advantage of the system that it can be adapted to different flow velocities and flow volumes in a simple and low-cost manner by connecting additional compressor stages to the existing three stages, or by disconnecting one or two of the existing three stages. This adaptation can be effected simply by the use of tie rods 45 of different lengths.

The reference numerals in the claims are not a limitation, but shall facilitate their understanding.

We claim:

1. A method for precooling the helium tank of a cryostat comprising the steps of cooling helium gas to the temperature of boiling nitrogen in a closed circuit, circulating the cooled helium through the helium tank, causing heating of the helium, and thereafter cooling the heated helium gas down to the temperature of boiling nitrogen.

2. A method according to claim 1, wherein the helium gas is cooled down in a plate heat exchanger.

3. A method according to claim 2, wherein the helium gas flows through the heat exchanger, while boiling nitrogen is circulated around the heat exchanger.

4. A method according to claim 3, wherein the enthalpy of vaporization of the nitrogen is utilized for cooling the helium gas and the heat exchanger is constantly supplied with a quantity of liquid nitrogen corresponding to the vaporizing nitrogen.

5. A method according to claim 1, wherein the helium gas is delivered by means of a compressor.

6. A method according to claim 1, wherein the pressure of the helium gas is maintained by means of a reservoir.

7. A device for precooling a helium tank disposed in a cryostat, prior to filling with liquefied helium, said device comprising compressor means for circulating helium gas, a heat exchanger with a chamber exposed to an external cooling agent and closed helium gas circuit means, interconnecting the helium tank, disposed in the cryostat, the heat exchanger chamber, of the heat exchanger, and the compressor, for absorbing thermal energy from the cryostat helium tank.

8. A device according to claim 7, wherein said heat exchanger chamber is the inner space of a plate heat exchanger.

9. A device according to claim 7, wherein said heat exchanger is surrounded by boiling nitrogen.

10. A device according to claim 7, wherein said heat exchanger is suspended in an open tank and the device further comprises means for constantly supplying liquid nitrogen to the open tank in an amount corresponding to vaporizing nitrogen.

11. A device according to claim 7, wherein said circuit comprises a helium reservoir.

12. A device according to claim 7, wherein said compressor (4) is a multi-stage axial-flow compressor with impeller and guide wheels.

13. A device according to claim 12, wherein said compressor (4) comprises a sandwich construction of impeller and guide and the stages are interconnected by tension bars arranged about a circumference of the compressor.

14. A device according to claim 13, wherein seals are disposed between the individual impeller and guide stages.

15. A device according to claim 7, wherein a drive of the said wheel (54) is arranged in the housing of the said compressor.

16. A device according to claim 15, wherein said impeller wheel is arranged around the drive which extends axially relative to the direction of flow.

17. A device according to claim 16, wherein the guide wheel has a core matching the diameter of the axially arranged drive.

18. A device according to claim 15, wherein said drive comprises an electric motor.

19. A device according to claim 7, wherein an inlet of the said compressor has a conically widening shape and comprises an inner cone splitting up the gas flow into a conical shell and guiding the gas flow axially around the said compressor drive.

20. A device according to claim 19, wherein an outlet pipe of the said compressor tapers conically and comprises a cone corresponding to that of said inlet pipe and guide ribs extending in the longitudinal direction are provided on the inside of the conical jacket.

21. A device according to claim 20, wherein the heat exchanger chamber comprises an inner space of a plate heat exchanger, the heat exchanger is surrounded by boiling nitrogen, the heat exchanger is suspended in an open tank, the circuit comprises a helium reservoir, the compressor is a multi-stage axial-flow compressor with impeller and guide wheels, the drive of the said impeller wheel is arranged in a housing of the compressor, the impeller wheel is arranged around the drive which extends axially relative to the direction of flow, the drive consists of an electric motor, the guide wheel has a core matching the diameter of the axially arranged drive, the compressor comprises a sandwich construction of impeller and guide stages and the stages are interconnected by tension bars arranged about a circumference of the compressor and seals are disposed between the individual impeller and guide stages.

* * * * *